(12) United States Patent
Yoon

(10) Patent No.: US 6,433,719 B2
(45) Date of Patent: Aug. 13, 2002

(54) DIGITAL-ANALOGUE TRANSFORMER USING RESISTOR STRING

(75) Inventor: Eui-Shik Yoon, Seoul (KR)

(73) Assignee: Hyundai Electronics Industries Co., Ltd., Ichon (KR)

(*) Notice: Subject to any disclaimer, the term of this patent is extended or adjusted under 35 U.S.C. 154(b) by 0 days.

(21) Appl. No.: 09/818,542

(22) Filed: Mar. 28, 2001

(30) Foreign Application Priority Data

Jul. 20, 2000 (KR) .......................................... 00-41750

(51) Int. Cl.[7] ................................................ H03M 1/66
(52) U.S. Cl. .................. 341/144; 341/145; 341/155; 341/153; 341/158; 341/159; 341/160
(58) Field of Search ................................ 341/144, 145, 341/159, 118, 153

(56) References Cited

U.S. PATENT DOCUMENTS 5,495,245 A * 2/1996 Ashe ........................... 341/145
6,163,289 A * 12/2000 Ginetti ........................ 341/145
6,201,491 B1 * 3/2001 Brunolli et al. ............. 341/144

* cited by examiner

Primary Examiner—Patrick Wamsley
Assistant Examiner—Lam T. Mai
(74) Attorney, Agent, or Firm—Fleshner & Kim, LLP

(57) ABSTRACT

The present invention provides a digital-analogue transformer that can include a voltage divider, a decoder, a switch, a voltage adder and an output voltage controller. A digital-analogue transformer according to the present invention can increase resolution by inserting an interpolation voltage between the divided voltages generated from a resistor string, can modify a swing width of an output voltage by placing an amplifier using a feedback RC parallel circuit on an output stage, can protect a circuit from 'glitch' according to a switching operation by connecting a capacitor to a resistor string and voltage input terminals, and can reduce an offset difference generated from respective channels by having each of the respective digital-analogue transforming channels share a reference voltage generator and a bias voltage generator. The present invention can be applied to a digital-analogue transformer of a resistor string type.

29 Claims, 8 Drawing Sheets

Offset error for a 3-bit DAC

DIGITAL-ANALOGUE TRANSFORMER USING RESISTOR STRING

BACKGROUND OF THE INVENTION

1. Field of the Invention

The present invention relates to a digital-analogue transformer, and in particular, to a resistor string type digital-analogue transformer.

2. Background of the Related Art

A digital-analogue transformer is a device that transforms digital input signals into analogue output signals and is used in many fields such as A/V signal processors, measurement/control systems and the like. There are various types of the digital-analogue transformers such as resistor string, current cell matrix, sigma-delta, etc.

FIG. 1 shows a related art resistor string type digital-analogue transformer. As shown in FIG. 1, a digital-analogue transformer 102 is constituted with a high reference voltage generator 106a, a low reference voltage generator 106b, a resistor string 104, a switch 110, a decoder 112, a buffer 114, and a bias voltage generator 116, which are all built in a block.

The high and low reference voltage generators 106a and 106b respectively generate a high reference voltage $V_{REFH}$ and a low reference voltage $V_{REFL}$ that are between the analogue power source voltage AVDD and an analogue ground AGND. The low reference voltage $V_{REFL}$ is a little bit higher than the analogue ground AGND. The high reference voltage $V_{REFH}$ is a little bit lower than an analogue power source voltage AVDD. The reference voltage generator 106 produces stable reference voltages $V_{REFH}$ and $V_{REFL}$ despite the fluctuation of analogue power source voltage levels AVDD~AGND caused by external influences.

The resistor string 104 is constituted with a plurality of series connected resistors that have identical resistances. The high reference voltage $V_{REFH}$ and the low reference voltage $V_{REFL}$ are applied to both ends of the resistor string 104, respectively. The high reference voltage $V_{REFH}$ brings about successive voltage drops at the respective resistors of the resistor string 104 to produce divided voltages $V_{DIV}$ at the respective nodes therein. When the number of resistors constructing the resistor string 104 is n, the number of produced divided voltages $V_{DIS}$ is n and each of the intervals is $V_{REFH}$/n equivalently. Resolution of the digital-analogue transformer depends on the number of the divided voltages $V_{DIV}$ and the interval. As the resolution is increased, the analogue output is more precisely produced.

The decoder 112 generates a decoded digital signal DEC by decoding a digital input signal D[0:9]. The switch 110 receives the divided voltages $V_{DIV}$ from the resistor string 104 and is controlled by the decoded digital signal DEC outputted from the decoder 112. The switch 110 outputs a divided voltage $V_{DIV}$ as a DC voltage VD having a level that corresponds to the value of the digital input signal D[0:9].

The buffer 114 is a unity gain voltage amplifier that has a non-inversion input terminal+receive a reference voltage $V_{COM}$, while an output AOUT is fed back to an inversion input terminal−. The buffer 114 receives the DC voltage $V_{DC}$ at the inversion input terminal−. Then, the buffer 114 outputs the analogue output voltage AOUT by maintaining its voltage level and by improving only its current driving ability. A bias voltage $V_{BIAS}$ is applied to the buffer 114, which is supplied by the built-in bias voltage generator 116.

FIG. 2 shows a block diagram of a related art multi-channel digital-analogue transformer. As shown in FIG. 2, a plurality of unit digital-analogue transforming channels (102a, 102b, ..., 102m) being m in number are connected in parallel to one another to constitute a multi-channel digital-analogue transformer. Each of the unit digital-analogue transforming channels 102 generates an analogue output voltage AOUT by receiving a digital input signal D[n0:n9] of 10 bits. Further, each of the digital-analogue transforming channels 102 is connected to an analogue power source voltage AVDD and an analogue ground AGND and shares a reference voltage $V_{COM}$.

Offset, differential non-linearity (DNL), integral non-linearity (INL), signal to noise (SNR), and the like pertain to the characteristics of the digital-analogue transformer. FIG. 3 shows a graph of the offset error. As shown in FIG. 3, an output voltage corresponding to the lowest bit of a digital input signal is not 0 but 1/n V, which is called an offset error. When the digital-analogue transformer is formed with multi-channels, it is difficult to produce a precise analogue output voltage provided that the respective offsets among the channels differ in size.

As described above, the related art digital-analogue transformers have various problems. The number of resistors of a resistor string should be increased, however, as the number of bits of a digital input signal increases, an increased or a larger chip size is required. Further, constitutions of a high reference voltage generator and a low reference voltage generator should be reconstructed whenever a system is designed to increase or reduce a swing width of an analogue output voltage in accordance with the system characteristics. Also, characteristics of DNL, INL, SNR and the like are deteriorated because of a 'glitch' during a switching mode of the switch. In addition, offset differences between the respective channels of a multi-channel digital-analogue transformer increase, thereby generating errors.

The above references are incorporated by reference herein where appropriate for appropriate teachings of additional or alternative details, features and/or technical background.

SUMMARY OF THE INVENTION

An object of the invention is to solve at least the above problems and/or disadvantages and to provide at least the advantages described hereinafter.

Another object of the present invention is to provide a method of fabricating a semiconductor device that substantially obviate one or more of the problems due to limitations and disadvantages of the related art.

Another object of the present invention is to provide a digital-analogue transformer that improves or increases resolution by inserting an interpolation voltage between the divided voltages generated from a resistor string.

Another object of the present invention is to provide a digital-analogue transformer that changes a swing width of an output voltage by placing an amplifier using a feedback RC parallel circuit on an output stage.

Another object of the present invention is to provide a digital-analogue transformer that reduces 'glitch' based on a switching operation.

Another object of the present invention is to provide a digital-analogue transformer that reduces a 'glitch' in a circuit caused by a switching operation by connecting a capacitor to a resistor string and a reference voltage input terminal.

Another object of the present invention is to provide a digital-analogue transformer that reduces an offset difference generated from respective channels.

Another object of the present invention is to provide a digital-analogue transformer that reduces an offset difference generated among respective channels by having each of the respective digital-analogue transforming channels share a reference voltage generator and a bias voltage generator.

To achieve at least these and other advantages in a whole or in part and in accordance with the purpose of the present invention, as embodied and broadly described, a digital to analogue converter according to the present invention is provided that includes a voltage divider that generates a plurality of first divided voltages and a plurality of second divided voltages from corresponding nodes of a plurality of serial resistors coupled between a high reference voltage and a low reference voltage, a switch coupled to the voltage divider that receives a digital signal, wherein the switch outputs one of the first divided voltages as a first DC voltage corresponding to upper m bits of the digital signal and outputs one of the second divided voltages as a second DC voltage corresponding to lower n bits of the digital input signal, and a voltage adder that generates an added voltage by adding the first DC voltage to the second DC voltage.

To further achieve the above objects in a whole or in part a digital-analogue transformer according to the present invention is provided that includes a voltage divider that generates a first divided voltage and a second divided voltage from nodes of a plurality of serial resistors coupled between a high reference voltage and a low reference voltage, a decoder that generates a decoded digital signal by decoding a digital input signal a switch coupled to the voltage divider that is controlled by the decoded digital signal, wherein the switch outputs a divided voltage corresponding to the digital input signal, and an output voltage controller that generates an analogue output voltage by receiving the divided voltage through an amplifier having an amplifier output amplitude determined by a feedback RC parallel circuit.

To further achieve the above objects in a whole or in part a digital-analogue transformer according to the present invention is provided that includes a voltage divider that generates a first divided voltage and a second divided voltage from nodes of a plurality of resistors coupled in series as a resistor string between a high reference voltage and a low reference voltage, a decoder that generates a decoded digital signal by decoding a digital input signal, a switch coupled to the voltage divider that is controlled by the decoded digital signal, wherein the switch outputs the first divided voltage as a first DC voltage corresponding to upper m bits of the digital input signal, and wherein the switch outputs the second divided voltage as a second DC voltage corresponding to lower n bits of the digital input signal, a voltage adder that generates an added voltage by adding the first DC voltage to the second DC voltage, and an output voltage controller generating an analogue output voltage by receiving the added voltage through an amplifier having an upper output amplitude determined by a feedback RC parallel circuit.

To further achieve the above objects in a whole or in part a digital-analogue transformer according to the present invention is provided that includes a reference voltage generator that generates a high reference voltage lower than a first analogue reference voltage, wherein the reference voltage generator generates a low reference voltage higher than a second analogue reference voltage, wherein the high reference voltage is greater than the low reference voltage, a bias voltage generator that generates a bias voltage, and a plurality of unit digital-analogue transforming channels each including a voltage divider that generates a first divided voltage and a second divided voltage from nodes of a plurality of resistors connected between the high reference voltage and the low reference voltage, a decoder that generates a decoded digital signal by decoding an input signal, a switch controlled by the decoded digital signal, wherein the switch outputs the first divided voltage as a first DC voltage corresponding to upper m bits of the decoded digital signal, wherein the switch outputs the second divided voltage as a second DC voltage corresponding to lower n bits of the decoded digital input signal, a voltage adder that generates an added voltage by adding the first DC voltage to the second DC voltage, and an output voltage controller that generates an analogue output voltage by receiving the added voltage at an input terminal of an amplifier having an upper output amplitude determined by a feedback RC parallel circuit, and wherein the plurality of the unit digital-analogue transforming channels share the reference voltage generator and the bias voltage generator.

To further achieve the above objects in a whole or in part a digital-analogue transforming means according to the present invention is provided that includes voltage distributing means for generating a plurality of first divided voltages and a plurality of second divided voltages from nodes of a plurality of resistor means coupled in series between a high reference voltage and a low reference voltage, decoding means for generating a decoded digital signal by decoding a digital input signal, switching means controlled by the decoded digital signal for switching one of the first divided voltages as a first DC voltage corresponding to upper m bits of the digital input signal, wherein the switching means switches one of the second divided voltages as a second DC voltage corresponding to lower n bits of the decoded digital input signal, voltage adding means for generating an added voltage by adding the first DC voltage to the second DC voltage, and output voltage controlling means for generating an analogue output voltage by receiving the added voltage through an amplifier means having an upper output amplitude determined by a feedback RC parallel circuit means.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Figure 1:
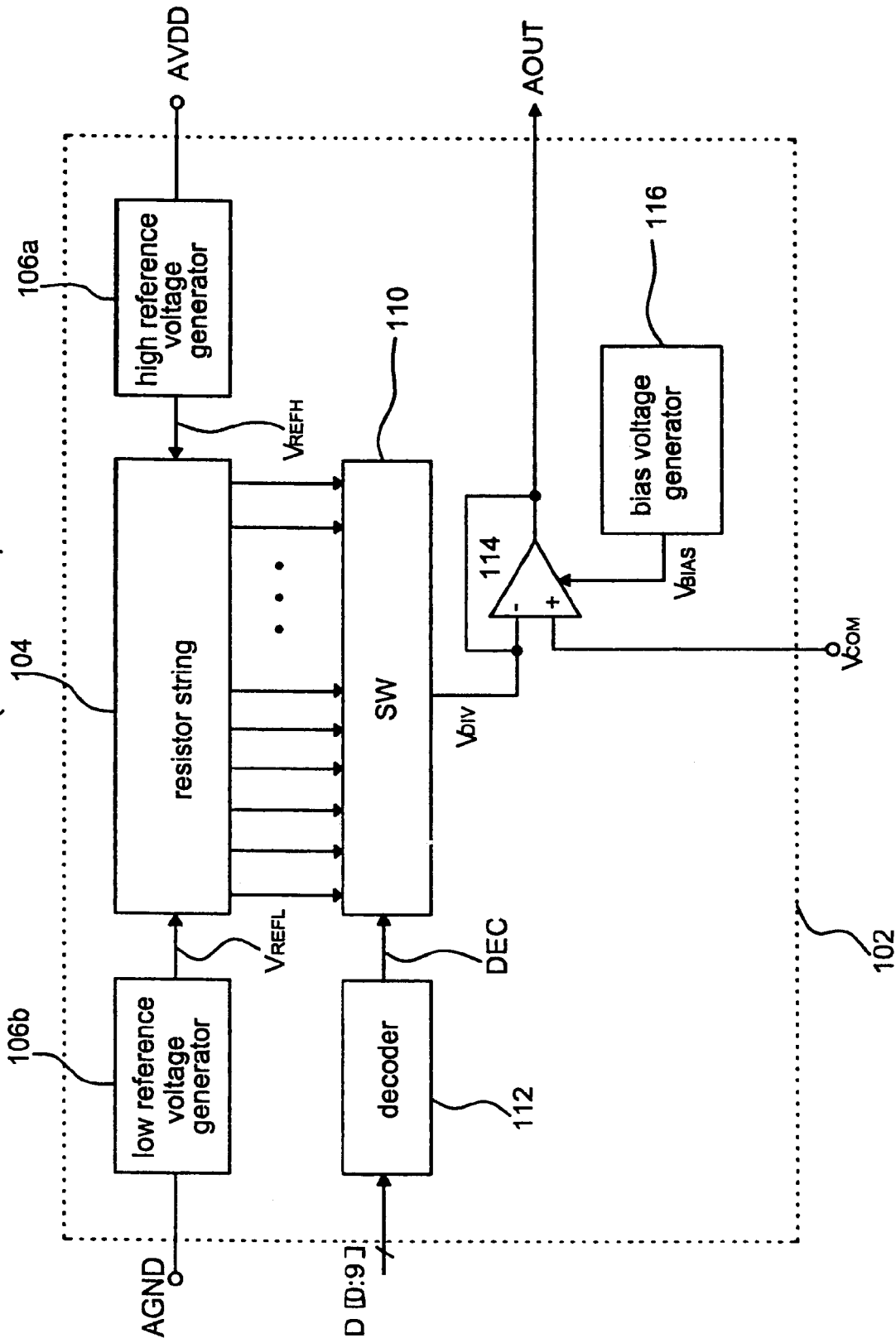
FIG. 1 is a diagram that shows a related art resistor string type digital-analogue transformer.
Figure 2:
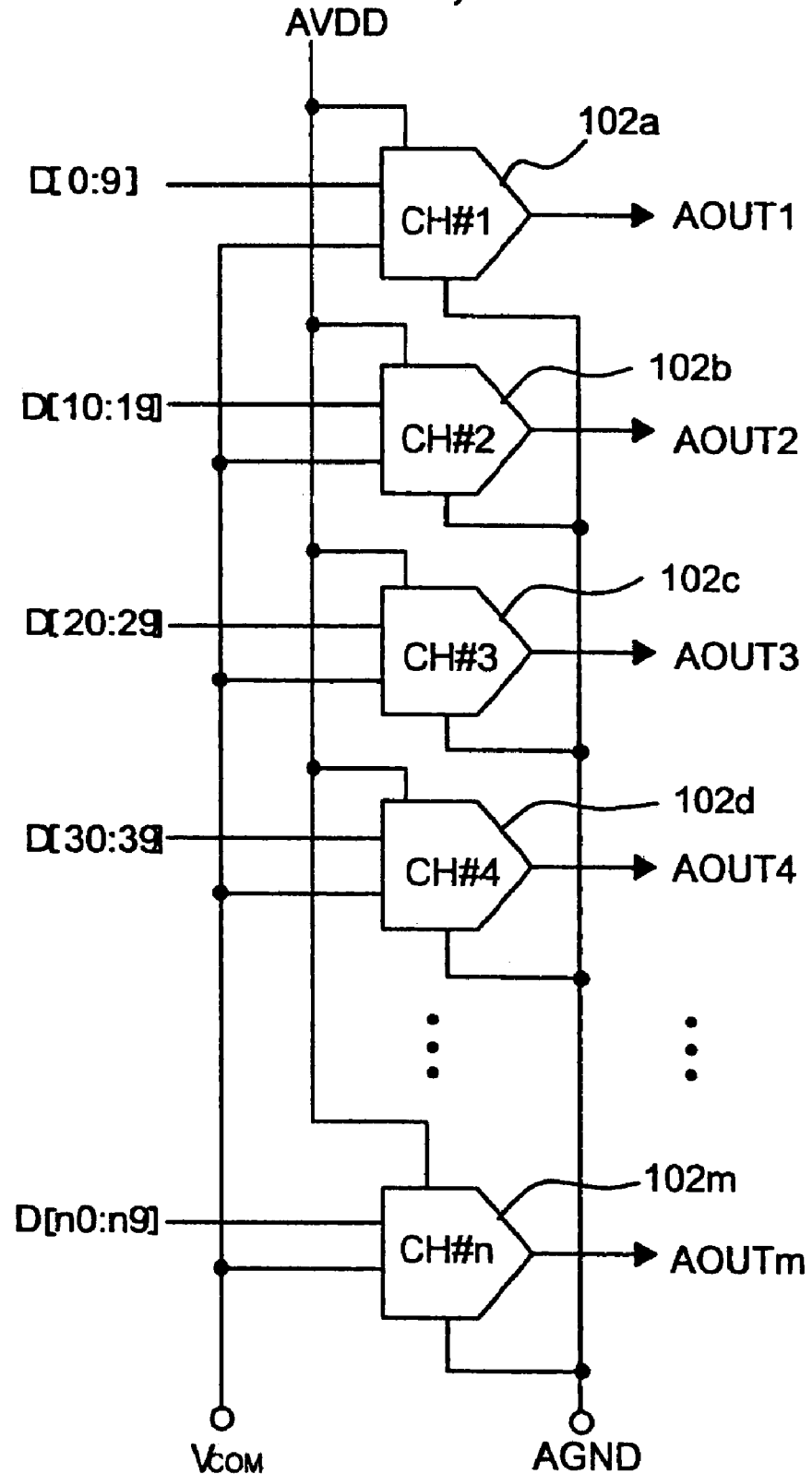
FIG. 2 is a diagram that shows a block diagram of a related art multi-channel digital-analogue transformer.
Figure 3:
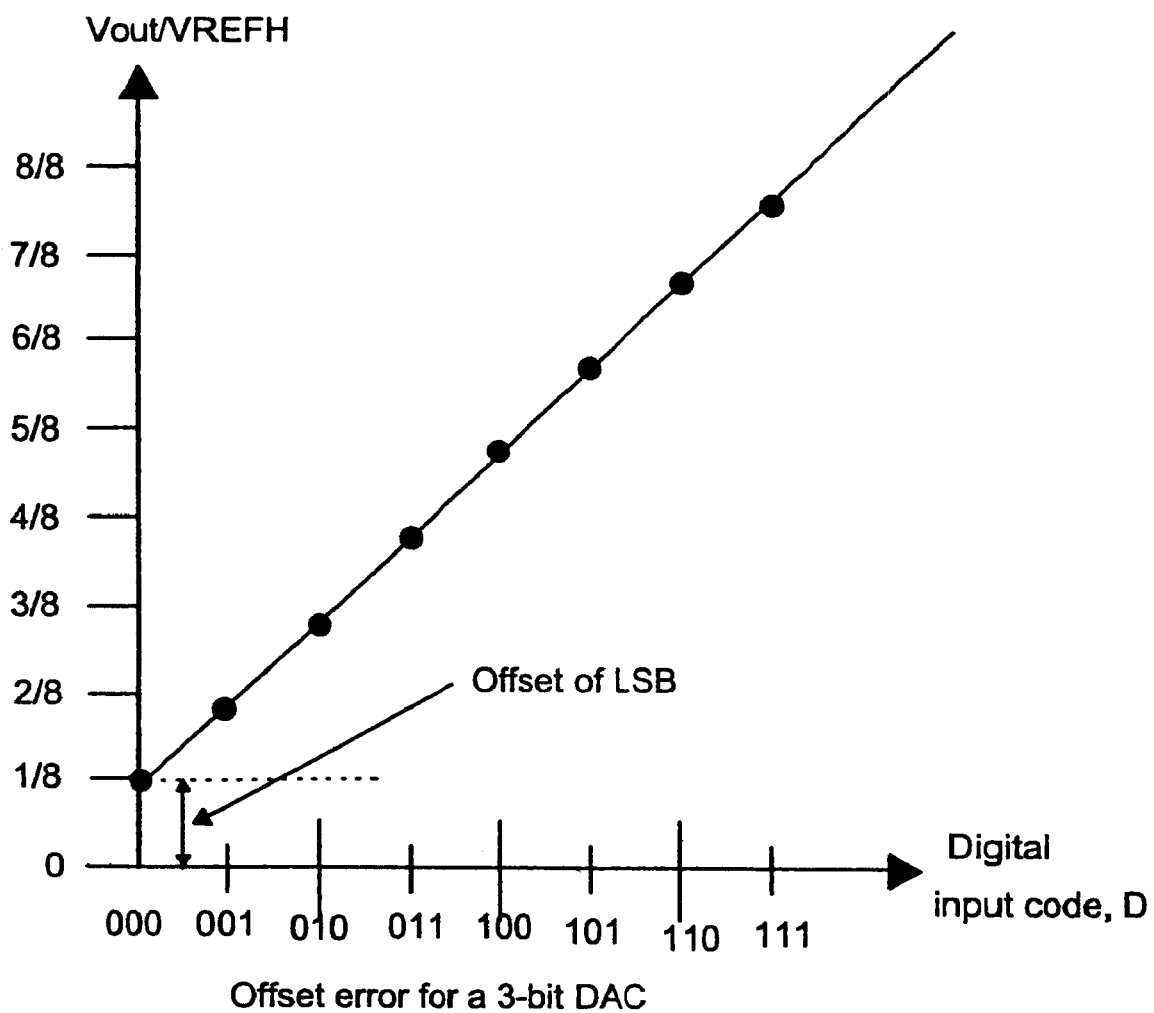
FIG. 3 is a diagram that shows a graph of the offset error of a related art digital-analogue transformer.
Figure 4:
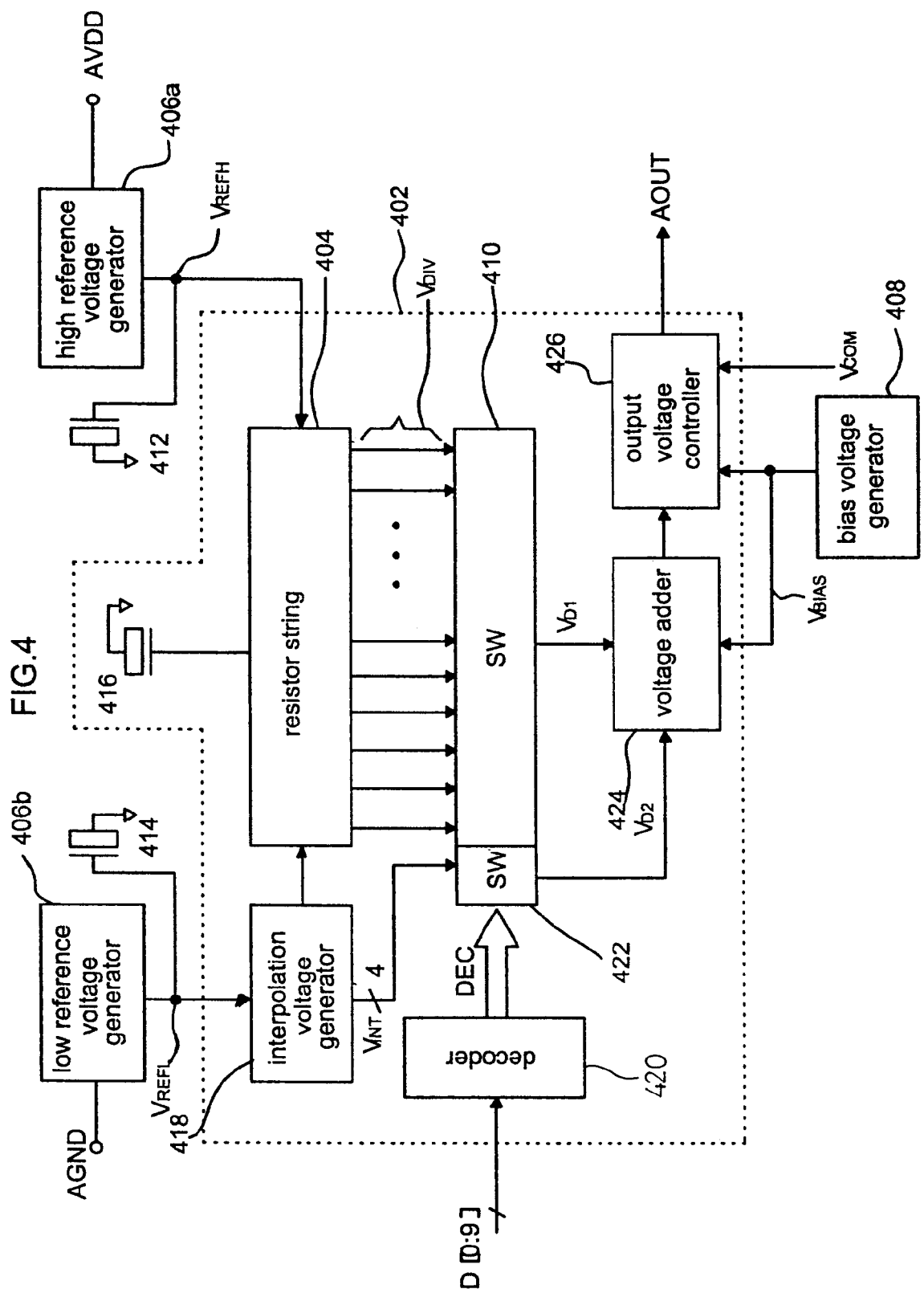
FIG. 4 is a block diagram that shows a preferred embodiment of a resistor string type digital-analogue transformer according to the present invention.

FIG. 4 is a diagram that shows a block diagram of a preferred embodiment of a resistor string type digital-analogue transformer according to the present invention. As shown in FIG. 4, a digital-analogue transformer 402 according to the present invention preferably includes a resistor string 404, an interpolation voltage generator 418, a decoder 420, a switch 410, a voltage adder 424, and an output voltage controller 426 only. A reference voltage generator 406 and a bias voltage generator 408 are preferably external to the transformer 402. The reference voltage generator 406 and the bias voltage generator 408 can be placed on an external part of the transformer 402.

The reference voltage generator 406 preferably includes a high reference voltage generator 406a and a low reference voltage generator 406b that respectfully generate a high reference voltage $V_{REFH}$ and a low reference voltage $V_{REFL}$ which are stable despite analogue power source voltage levels AVDD~AGND that are fluctuated by external influences.

The high reference voltage generator 406a preferably generates the high reference voltage $V_{REFH}$ a little bit lower than an analogue power source voltage AVDD. An NMOS capacitor 412 is coupled to an output terminal from which the high reference voltage $V_{REFH}$ is outputted by the high reference voltage generator 406a to reduce or minimize a 'glitch' generated when switching.

The low reference voltage generator 406b coupled to the analogue ground AGND preferably generates the low reference voltage $V_{REFL}$ a little bit higher than the analogue ground AGND. Another NMOS capacitor 414 is coupled to an output terminal from which the low reference voltage is outputted to reduce or minimize the 'glitch' generated when switching.

In the digital-analogue transforming channel 402, the resistor string 404 includes a plurality of serial resistors coupled each respectively having identical resistances. Both ends of the resistor string 404 are coupled to the high reference voltage $V_{REFH}$ and the interpolation voltage generator 418, respectively. Another NMOS capacitor 416 is coupled preferably at the center of the resistor string 404, which reduces or minimizes the 'glitch' generated when switching as well.

Voltage drops occurring at the respective resistors of the resistor string 404 bring about divided voltages $V_{DIV}$ differing in size with one another. When the number of resistors constructing the resistor string 404 is n, the number of produced divided voltages $V_{DIV}$ is n and each of the intervals is substantially $V_{REFH}/n$. Resolution of the digital-analogue transformer depends on the number of the divided voltages $V_{DIV}$ and the interval. The higher the resolution (e.g., additional resistors in the resistor string 404) becomes, the more precise analogue output becomes.

The interpolation voltage generator 418 is coupled between the resistor string 404 and the low reference voltage generator 406b. The interpolation voltage generator 418 preferably includes four identical resistors coupled in series. Thus, 4 interpolation voltages $V_{INT}$ are generated at the nodes respectively between the four resistors. However, the present invention is not intended to be so limited. For example, more or less interpolation voltages could be used. The interpolation voltage $V_{INT}$ ranges from the divided voltage of the lowest level generated from the resistor string 404 to the low reference voltage $V_{REFL}$.

The decoder 420 generates a decoded digital signal DEC by decoding a digital input signal D[0:9]. The switch 410 preferably includes first and second switches 410a and 410b. The first switch 410a receives a plurality of divided voltages $V_{DIV}$, which is controlled by the decoded digital signal DEC to output one divided voltage $V_{DIV}$ having a size corresponding to the upper 8 bits of the digital input signal D[0:9] as a first DC voltage $V_{D1}$. The second switch 410b receives a plurality of interpolation voltages $V_{INT}$ and is controlled by the decoded digital signal DEC to output another interpolation voltage $V_{INT}$ having a size corresponding to the lower 2 bits of the digital input signal D[0:9] as a second DC voltage $V_{D2}$. However, the present invention is not intended to be so limited. For example, alternative ratios of a 10 digit digital input signal can be used or a different sized digital input signal.

The voltage adder 424 preferably includes a pair of unity gain voltage amplifiers as buffers, which preferably generates an output voltage by adding a first DC voltage $V_{D1}$, and a second DC voltage $V_{D2}$. As the voltage adder 424 outputs the voltages by adding the divided voltage $V_{D1}$, and the interpolation voltage $V_{D2}$, the possible combinations of the analogue output voltages AOUT are increased greatly. Therefore, the preferred embodiment of the resistor string type digital analogue transformer according to the present invention increases resolution of the digital-analogue transformer remarkably.

The output voltage controller 426 as an integrator determines the maximum swing width of the analogue output voltage AOUT in accordance with the size of a feedback RC parallel circuit. Thus, a system designer can alter the swing width of the analogue output voltage AOUT with ease only by determining the RC value of the output voltage controller 426. The voltage adder 424 and the output voltage controller 426 are preferably driven by the bias voltage $V_{BIAS}$.

Figure 5:
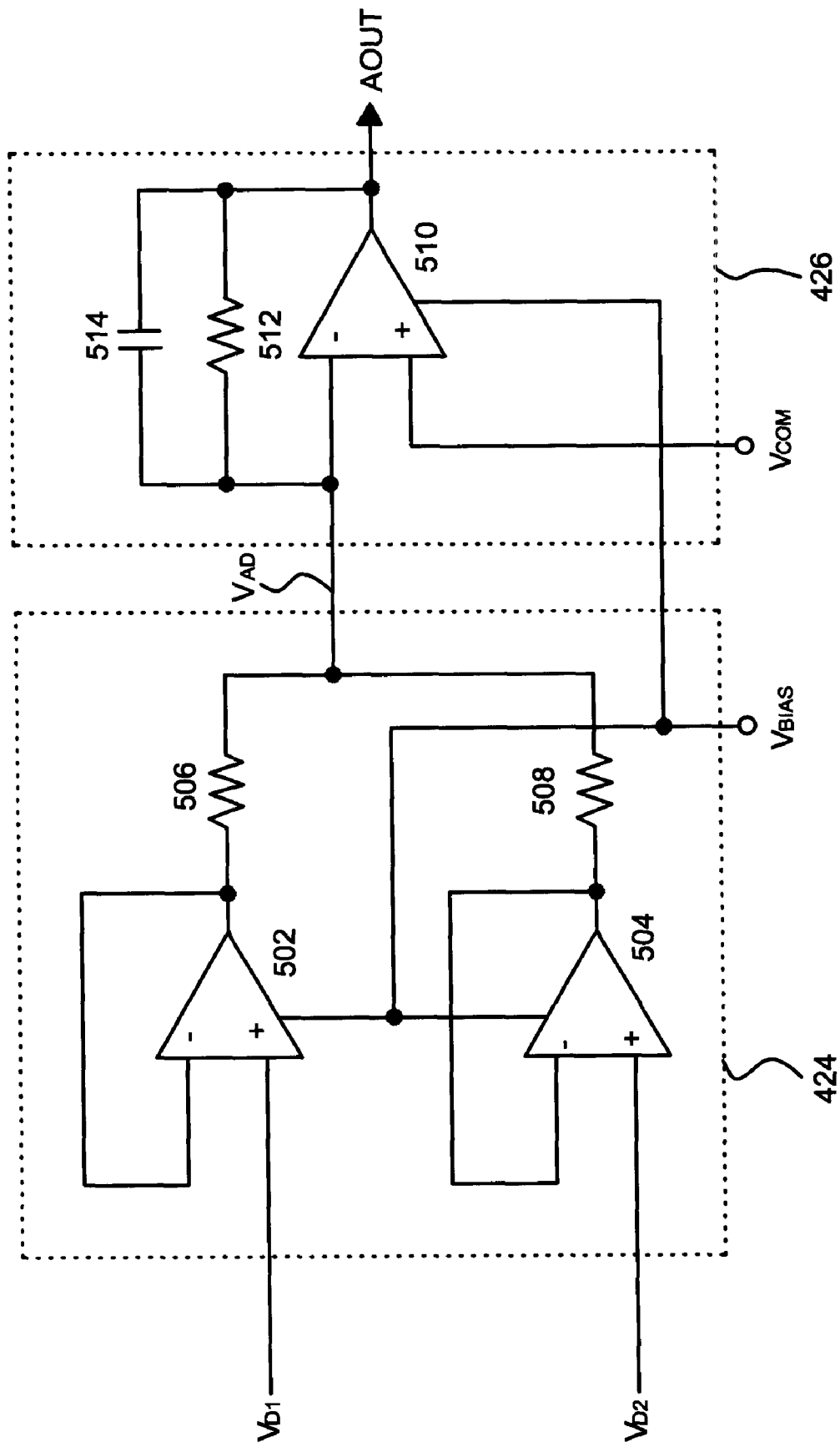
FIG. 5 is a diagram that shows circuits of a preferred embodiment of a voltage adder and an output voltage controller in a digital-analogue transformer according to the present invention.

FIG. 5 is a diagram that shows circuits of a preferred embodiment of a voltage adder and an output voltage controller in a digital-analogue transformer according to the present invention. As shown in FIG. 5, a voltage adder 424 preferably includes first and second buffers 502 and 504 and output resistors 506 and 508.

The first and second buffers 502 and 504 are operated by the bias voltage $V_{BIAS}$. Each output of the first and second buffers 502 and 504 is respectively fed back to an inversion input terminal–thereof to form a unity gain voltage amplifier. The non-inversion input terminal+of the first buffer 502 preferably receives a first DC voltage $V_{D1}$, whereby current driving force is improved or increased even though the output has the same voltage level. The non-inversion input terminal+of the second buffer 504 receives a second DC voltage $V_{D2}$, whereby a current driving force is improved or increased even though the output has the same voltage level. The voltage adder 424 preferably outputs an added voltage $V_{AD}$ by adding an output of the first buffer 502 to an output of the second buffer 504.

An inversion input terminal of the output voltage controller 426 receives the added voltage $V_{AD}$ and an analogue output voltage AOUT, which is an output signal fed back through a feedback RC parallel circuit that includes a resistor 512 and a capacitor 514. A non-inversion input terminal of the output voltage controller 426 receives a reference voltage $V_{COM}$. Thus, a swing width of the analogue output voltage AOUT is determined by the sizes of the resistor 512 and capacitor 514.

A system designer can alter the swing width of the analogue output voltage AOUT simply by determining the values of the resistor 512 and the capacitor 514. In this case, the size of the resistor 512 of the output voltage controller 426 is preferably approximately that of the resistors 506 and 508.

Figure 6:
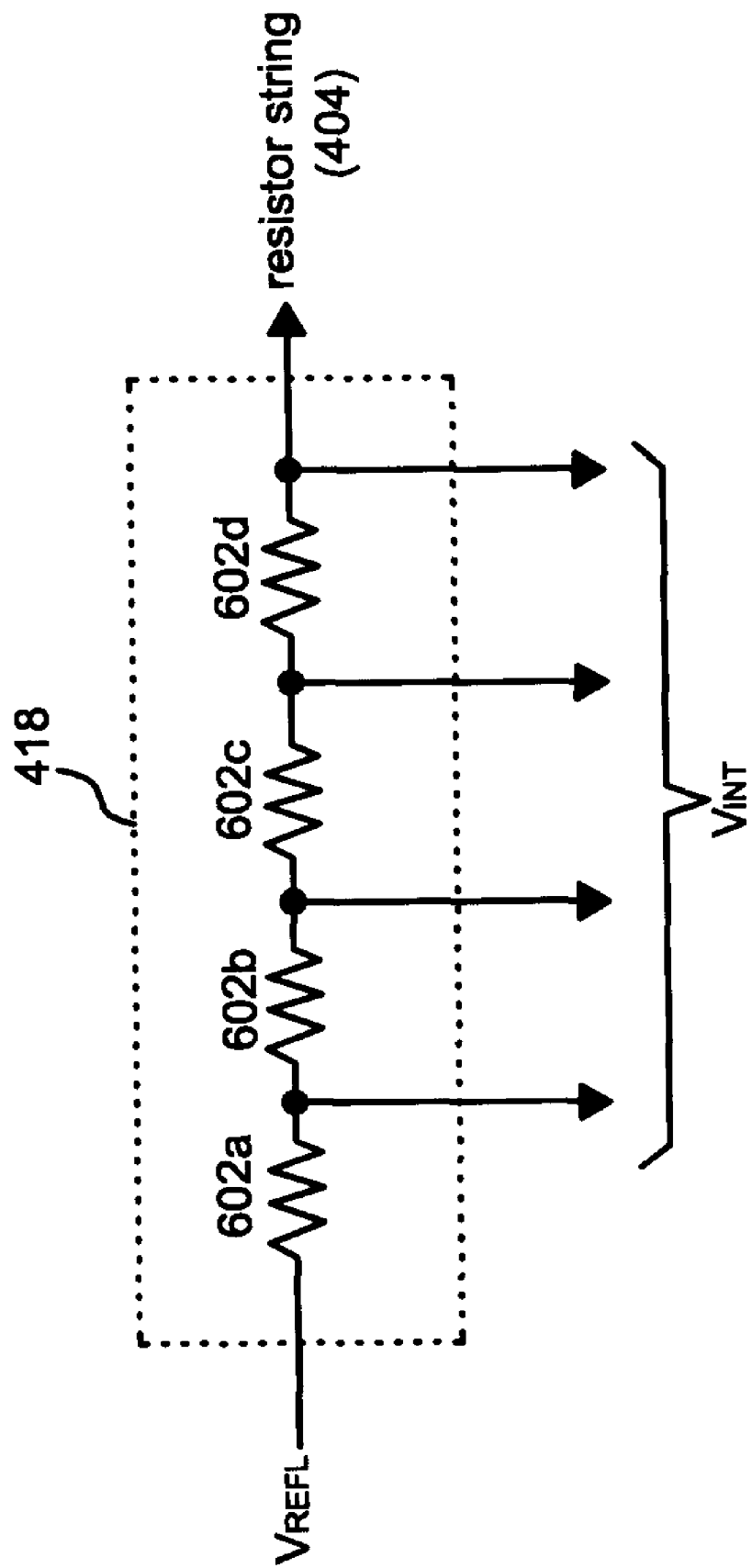
FIG. 6 is a diagram that shows a preferred embodiment of an interpolation voltage generator of a digital-analogue transformer according to the present invention.

FIG. 6 is a diagram that shows a preferred embodiment of an interpolation voltage generator of a digital-analogue transformer according to the present invention. As shown in FIG. 6, an interpolation voltage generator 418 consists of four resistors 602a to 602d that are coupled in series. Respective ends of the interpolation voltage generator 418 are coupled to a resistor string 404 and a low reference voltage $V_{REFL}$, respectively. The respective nodes of the interpolation voltage generator 418 produce four interpolation voltages $V_{INT}$, respectively.

Each size of the resistors constituting the interpolation voltage generator 418 preferably has approximately the same size of the corresponding resistor of the resistor string 404 or smaller. As the voltage between the ends of the resistor string 404 is larger than that between the ends of the interpolation voltage generator 418, the resistor string 404 preferably produces a divided voltage $V_{DIV}$ of high level and the interpolation voltage generator 418 generates an interpolation voltage $V_{INT}$ of relatively-low level by referring to a ground voltage as a reference.

Figure 7:
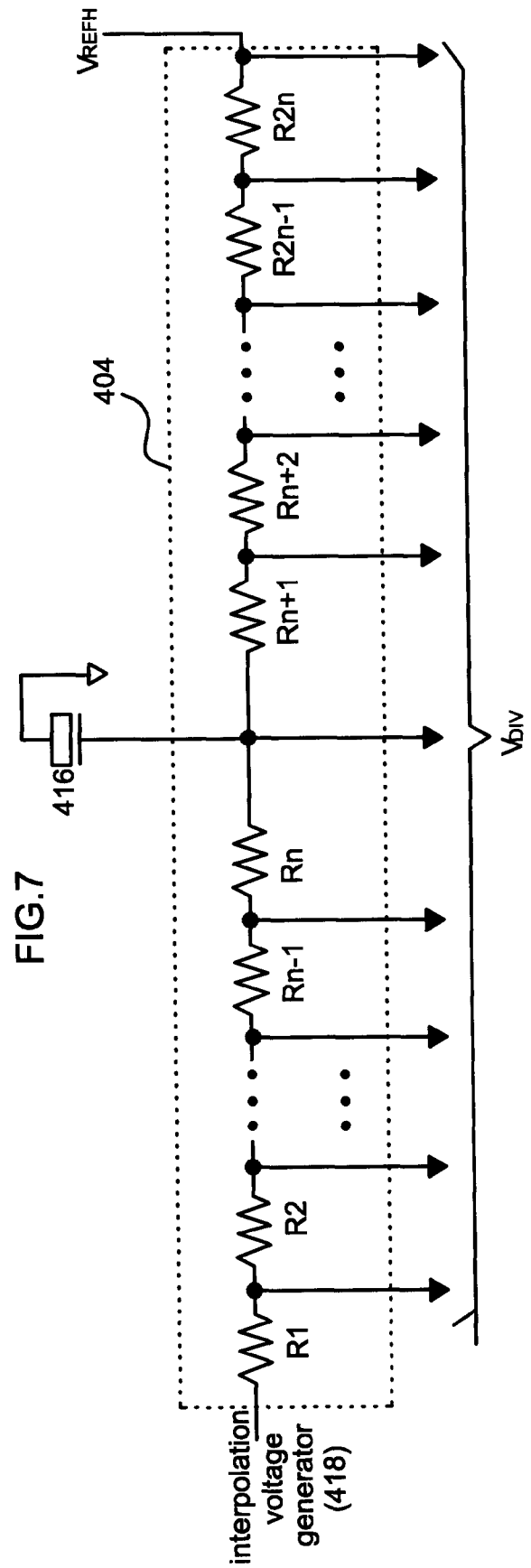
FIG. 7 is a diagram that shows a preferred embodiment of a resistor string of a digital-analogue transformer according to the present invention.

FIG. 7 is a diagram that shows a preferred embodiment of a string resistor of a digital-analogue transformer according to the present invention. As shown in FIG. 7, a resistor string 404 preferably includes 2n serial resistors. Respective ends of the resistor string 404 are coupled to a high reference voltage $V_{REFH}$ and an interpolation voltage generator 418, respectively. Thus, 2n divided voltages $V_{DIV}$ are attained by the respective nodes of the serial resistors. An NMOS capacitor 416 preferably coupled to the central node of the serial resistors.

Figure 8:
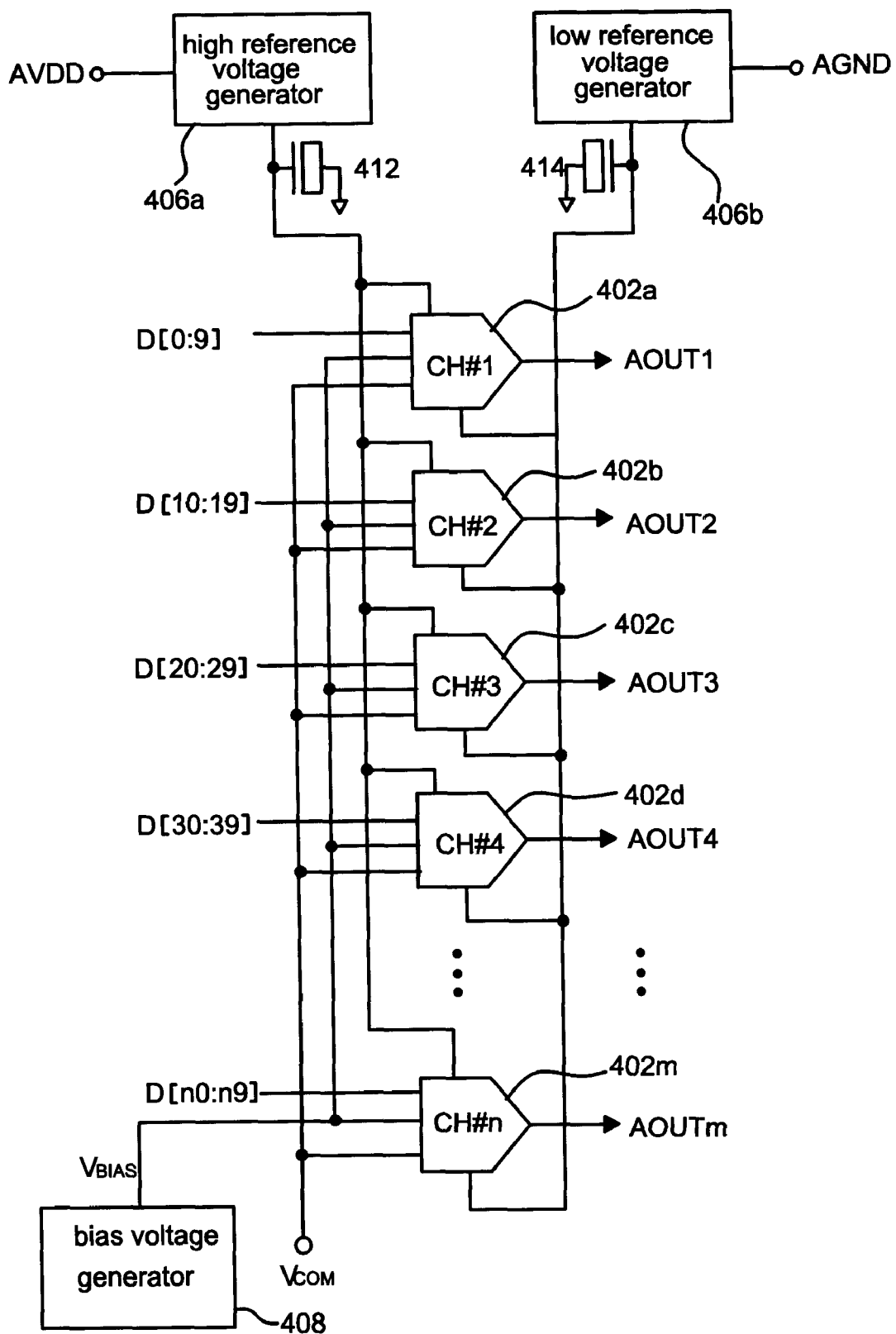
FIG. 8 is a block diagram that shows a preferred embodiment of a multi-channel digital-analogue transformer according to the present invention.

FIG. 8 is a block diagram that shows a preferred embodiment of a multi-channel digital-analogue transformer according to the present invention. As shown in FIG. 8, a plurality of unit digital-analogue transforming channels 402a, 402b, . . . , 402m being m in number are coupled in parallel to one another to form a multi-channel digital-analogue transformer. Each of the unit digital-analogue transforming channels 402 in FIG. 8 preferably generates an analogue output voltage AOUT (e.g., AOUT1, . . . , AOUTm) by receiving a digital input signal D[n0:n9] of 10 bits. Further, each of the digital-analogue transforming channels 402 in FIG. 8 is coupled to an analogue power source voltage AVDD and an analogue ground AGND as well as sharing a reference voltage $V_{COM}$.

Preferably, all the unit digital-analogue transforming channels 402 share a high reference voltage generator 406a, a low reference voltage generator 406b, and a bias voltage generator 408 to reduce or minimize the offset differences among the respective digital-analogue transforming channels.

As described above, preferred embodiments according to the present invention have various advantages. Preferred embodiments of a digital analogue transformer can increase resolution by inserting an interpolation voltage between divided voltages generated from a resistor string. Further, a swing width of an output voltage can easily be changed by placing an amplifier using a feedback RC parallel circuit on an output stage. Preferred embodiments according to the present invention can reduce or protect a circuit from 'glitch' according to a switching operation by coupling a capacitor to a resistor string and at least one reference voltage input terminal. Moreover, preferred embodiments according to the present invention can reduce or minimize an offset difference generated from the respective channels by having each of the respective digital-analogue transforming channels share at least one reference voltage generator and a bias voltage generator.

The foregoing embodiments and advantages are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A digital-analogue transformer comprising:
    a voltage divider that generates a plurality of first divided voltages and a plurality of second divided voltages from nodes of a plurality of serial resistors coupled between a high reference voltage and a low reference voltage;
    a switch coupled to the voltage divider that receives a digital signal, wherein the switch outputs one of the first divided voltages as a first DC voltage corresponding to first m bits of the digital signal and outputs one of the second divided voltages as a second DC voltage corresponding to second n bits of the digital input signal, wherein first voltage differences between adjacent nodes generating the first divided voltages are larger than second voltage differences between adjacent nodes generating the second divided voltages; and
    a voltage adder that generates an added voltage by adding the first DC voltage to the second DC voltage.

2. The digital-analogue transformer of claim 1, further comprising a decoder that generates the digital signal by decoding an input digital signal.

3. The digital-analogue transformer of claim 1, wherein the switch comprises:
    a first switch that outputs the first DC voltage corresponding to the first m bits of an input digital signal by being controlled by the digital signal; and
    a second switch that outputs the second DC voltage corresponding to the second n bits of the input digital signal by being controlled by the digital signal.

4. The digital-analogue transformer of claim 1, wherein the voltage adder comprises:
    a first buffer that receives the first DC voltage, wherein the first buffer outputs the received first DC voltage having an increased current driving capability; and
    a second buffer that receives the second DC voltage, wherein the second buffer outputs the received second DC voltage having an increased current driving capacity, wherein the voltage adder generates the added voltage by adding an output of the first buffer to an output of the second buffer.

5. A digital-analogue transformer comprising:
    a voltage divider that generates a first divided voltage and a second divided voltage from nodes of a plurality of serial resistors coupled between a high reference voltage and a low reference voltage, capacitor is coupled to a selected node of the voltage divider;

a decoder that generates a decoded digital signal by decoding a digital input signal;

a switch coupled to the voltage divider that is controlled by the decoded digital signal, wherein the switch outputs a divided voltage corresponding to the digital input signal; and an output voltage controller that generates an analogue output voltage by receiving the divided voltage through an amplifier.

6. The digital-analogue transformer of claim 5, wherein the voltage divider comprises:

a first capacitor connected to an input terminal of the high reference voltage and one end of a resistor string being the plurality of serial resistors; and a second capacitor connected to an input terminal of the low reference voltage and the other end of the resistor string.

7. The digital-analogue transformer of claim 6, wherein the third capacitor is connected to a center node of the serial resistors, wherein a first plurality of the serial resistors output the first divided voltage and a second plurality of the serial resistors output a second divided voltage, and wherein the first and second pluralities of resistors have different sizes.

8. The digital-analogue transformer of claim 5, wherein the capacitor is connected to a selected node of the nodes of the plurality of serial resistors.

9. The digital-analogue transformer of claim 8, wherein a gain of the amplifier is determined by a parallel RC feedback circuit, and wherein the capacitor is connected to a center node of the plurality of serial resistors.

10. The digital-analogue transformer of claim 6, further comprising third capacitor is connected to a selected node of the nodes of the plurality of serial resistors.

11. The digital-analogue transformer of claim 5, wherein first voltage differences between adjacent nodes generating the first divided voltages are larger than second voltage differences between adjacent nodes generating the second divided voltages.

12. A digital-analogue transformer comprising:

a voltage divider that generates a first divided voltage and a second divided voltage from nodes of a plurality of resistors coupled in series as a resistor string between a high reference voltage and a low reference voltage, wherein first voltage differences between adjacent nodes generating the first divided voltages are larger than second voltage differences between adjacent nodes generating the second divided voltages;

a decoder that generates a decoded digital signal by decoding a digital input signal;

a switch coupled to the voltage divider that is controlled by the decoded digital signal, wherein the switch outputs the first divided voltage as a first DC voltage corresponding to upper m bits of the digital input signal, and wherein the switch outputs the second divided voltage as a second DC voltage corresponding to lower n bits of the digital input signal;

a voltage adder that generates an added voltage by adding the first DC voltage to the second DC voltage; and an output voltage controller generating an analogue output voltage by receiving the added voltage through an amplifier having an upper output amplitude determined by a feedback circuit.

13. The digital-analogue transformer of claim 12, wherein the voltage divider comprises:

a first capacitor connected to an input terminal of the high reference voltage and one end of the resistor string;

a second capacitor connected to an input terminal of the low reference voltage and the other end of the resistor string; and a third capacitor connected to a selected node of the nodes of the plurality of resistors.

14. The digital-analogue transformer of claim 13, wherein the third capacitor is connected to a center node of the serial resistors, wherein a first plurality of the resistor string resistors output the first divided voltage and a second plurality of the resistor string resistors output the second divided voltage, and wherein the first and second plurality of resistors have different sizes.

15. The digital-analogue transformer of claim 14, wherein the voltage adder comprises:

a first buffer that receives the first DC voltage, wherein the first buffer outputs the received first DC voltage having an increased current driving capability; and a second buffer that receives the second DC voltage, wherein the second buffer outputs the received second DC voltage having an increased current driving capacity, wherein the voltage adder generates the added voltage by adding an output of the first buffer to an output of the second buffer.

16. The digital-analogue transformer of claim 15, wherein the switch comprises:

a first switch that outputs the first divided voltage as the first DC voltage corresponding to the upper m bits of the digital input signal by being controlled by the decoded digital signal; and a second switch that outputs the second divided voltage as the second DC voltage corresponding to lower n bits of the digital input signal by being controlled by the decoded digital signal.

17. The digital-analogue transformer of claim 12, wherein a gain of the amplifier is determined by a parallel RC feedback circuit.

18. A digital-analogue transformer comprising:

at least one reference voltage generator that generates a high reference voltage lower than a first analogue reference voltage, wherein the at least one reference voltage generator generates a low reference voltage higher than a second analogue reference voltage, wherein the high reference voltage is greater than the low reference voltage;

a bias voltage generator that generates a bias voltage; and a plurality of unit digital-analogue transforming channels each comprising, a voltage divider that generates a first divided voltage and a second divided voltage from nodes of a plurality of resistors connected between the high reference voltage and the low reference voltage, p1 a decoder that generates a decoded digital signal by decoding an input signal, a switch controlled by the decoded digital signal, wherein the switch outputs the first divided voltage as a first DC voltage corresponding to upper m bits of the decoded digital signal, wherein the switch outputs the second divided voltage as a second DC voltage corresponding to lower n bits of the decoded digital input signal, a voltage adder that generates an added voltage by adding the first DC voltage to the second DC voltage, an output voltage controller that generates an analogue output voltage by receiving the added voltage at an input terminal of an amplifier having an upper output amplitude determined by a feedback circuit, and wherein the plurality of the unit digital-analogue transforming channels share the at least one reference voltage generator and the bias voltage generator.

19. The digital-analogue transformer of claim 18, the voltage divider further comprising:

a first capacitor coupled to an input terminal of the high reference voltage;

a second capacitor coupled to an input terminal of the low reference voltage; and a third capacitor coupled to a selected node of the plurality of the serial resistors.

20. The digital-analogue transformer of claim 18, wherein the resistors are connected in series, wherein a first plurality of the series resistors output the first divided voltage and a second plurality of series resistors output the second divided voltage, and wherein the first and second plurality of resistors have different sizes.

21. The digital-analogue transformer of claim 18, wherein the switch comprises:

a first switch that outputs the first divided voltage as the first DC voltage corresponding to the upper m bits of the input signal by being controlled by the decoded digital signal; and a second switch that outputs the second divided voltage as the second DC voltage corresponding to lower n bits of the input signal by being controlled by the decoded digital signal.

22. The digital-analogue transformer of claim 18, wherein the voltage adder comprises:

a first buffer that receives the first DC voltage, the first buffer outputting the received first DC voltage having an increased current driving capability; and a second buffer that receives the second DC voltage, the second buffei outputting the received second DC voltage having an increased current driving capacity, wherein the voltage adder generates the added voltage by adding an output of the first buffer to an output of the second buffer.

23. The digital-analogue transformer of claim 18, wherein the feedback circuit is a RC parallel circuit.

24. A digital-analogue transforming means comprising:

voltage distributing means for generating a plurality of first divided voltages and a plurality of second divided voltages from nodes of a plurality of resistor means coupled in series between a high reference voltage and a low reference voltage;

decoding means for generating a decoded digital signal by decoding a digital input signal;

switching means controlled by the decoded digital signal for switching one of the first divided voltages as a first DC voltage corresponding to upper m bits of the digital input signal, wherein the switching means switches one of the second divided voltages as a second DC voltage corresponding to lower n bits of the decoded digital input signal;

voltage adding means for generating an added voltage by adding the first DC voltage to the second DC voltage; and output voltage controlling means for generating an analogue output voltage by receiving the added voltage through an amplifier means having an upper output amplitude determined by a feedback RC parallel circuit means.

25. The digital-analogue transforming means of claim 24, wherein the voltage distributing means comprises:

a first capacitor connected to an input terminal of the high reference voltage;

a second capacitor connected to an input terminal of the low reference voltage; and a third capacitor connected to a selected node of the plurality of the resistor means.

26. The digital-analogue transforming means of claim 24, wherein first voltage differences between adjacent nodes generating the first divided voltages are larger than second voltage differences between adjacent nodes generating the second divided voltages.

27. The digital-analogue transforming means of claim 24, wherein the switching means comprises:

first switching means for outputting the first divided voltage as the first DC voltage corresponding to the upper m bits of the digital input signal by being controlled by the decoded digital signal; and a second switching means for outputting the second divided voltage as the second DC voltage corresponding to the lower n bits of the digital input signal by being controlled by the decoded digital signal.

28. The digital-analogue transformer of claim 24, wherein the voltage adding means comprises:

first buffering means for receiving the first DC voltage, wherein the first buffering means outputs the received first DC voltage having an increased current; and second buffering means for receiving the second DC voltage, wherein the first buffering means outputs the received second DC voltage having an increased current;

wherein the voltage adding means generates the added voltage by adding an output of the first buffering means to an output of the second buffering means.

29. A digital-analogue transformer, comprising:

a voltage divider that generates a plurality of first divided voltages and a plurality of second divided voltages from nodes of a plurality of serial resistors coupled between a high reference voltage and a low reference voltage;

a switch coupled to the voltage divider that receives a digital signal, wherein the switch outputs one of the first divided voltages as a first DC voltage corresponding to upper m bits of the digital signal and outputs one of the second divided voltages as a second DC voltage corresponding to lower n bits of the digital input signal; and a voltage adder that generates an added voltage by adding the first DC voltage to the second DC voltage, wherein the voltage adder comprises, a first buffer that receives the first DC voltage, wherein the first buffer outputs the received first DC voltage having an increased current driving capability; and a second buffer that receives the second DC voltage, wherein the second buffer outputs the received second DC voltage having an increased current driving capacity, and wherein the voltage adder generates the added voltage by adding an output of the first buffer to an output of the second buffer.

* * * * *